(12) United States Patent
Sato et al.

(10) Patent No.: US 11,345,994 B2
(45) Date of Patent: May 31, 2022

(54) METHOD FOR FORMING COATING FILM ON POWDER, CONTAINER FOR USE IN FORMATION OF COATING FILM ON POWDER, AND ALP APPARATUS

(71) Applicant: Creative Coatings Co., Ltd., Tokyo (JP)

(72) Inventors: Eiji Sato, Tokyo (JP); Hitoshi Sakamoto, Tokyo (JP)

(73) Assignee: Creative Coatings Co., Ltd., Tokyo (JP)

( * ) Notice: Subject to any disclaimer, the term of this patent is extended or adjusted under 35 U.S.C. 154(b) by 0 days.

(21) Appl. No.: 17/159,526

(22) Filed: Jan. 27, 2021

(65) Prior Publication Data

US 2021/0147979 A1    May 20, 2021

Related U.S. Application Data

(63) Continuation of application No. PCT/JP2019/047394, filed on Dec. 4, 2019.

(30) Foreign Application Priority Data

May 24, 2019    (JP) .............................. JP2019-098028

(51) Int. Cl.
  *C23C 16/44*   (2006.01)
  *C23C 16/455*  (2006.01)
(52) U.S. Cl.
  CPC .... *C23C 16/4417* (2013.01); *C23C 16/45527* (2013.01); *C23C 16/45544* (2013.01)

(58) Field of Classification Search
  CPC ........... H01L 21/0228; C23C 16/45525; C23C 16/45544; C23C 16/4417; C23C 16/4527
  See application file for complete search history.

(56) References Cited

U.S. PATENT DOCUMENTS

| 2013/0059079 A1 | 3/2013 | Yuasa |
| 2015/0125599 A1* | 5/2015 | Lindfors ........... C23C 16/45555 427/213 |
| 2020/0385860 A1* | 12/2020 | Hirose ................ C23C 16/4482 |

FOREIGN PATENT DOCUMENTS

| JP | 2008-038218 A | 2/2008 |
| JP | 2014-159623 A | 9/2014 |
| JP | 5761724 B2 | 6/2015 |
| JP | 2015-520297 A | 7/2015 |
| JP | 2017137550 A | 8/2017 |
| WO | WO2013171360 A1 | 11/2013 |
| WO | WO2019098289 A1 | 5/2019 |

* cited by examiner

*Primary Examiner* — Tabassom Tadayyon Eslami
(74) *Attorney, Agent, or Firm* — Nolan Heimann LLP; David L. Hoffman (57) ABSTRACT

A method for forming a coating film on a powder includes: a dispersion step of setting a container having contained the powder P in a main body of a dispersion device, and dispersing the powder in the container by the main body of the dispersion device; and an ALD step for forming the coating film on a surface of the powder, by setting the container having been removed from the main body of the dispersion device in a main body of an ALD apparatus in such a state that gas can be introduced and be exhausted, introducing a gas for performing an ALD cycle into the container, filling the container with the gas, and then exhausting the gas.

15 Claims, 5 Drawing Sheets

METHOD FOR FORMING COATING FILM ON POWDER, CONTAINER FOR USE IN FORMATION OF COATING FILM ON POWDER, AND ALP APPARATUS

CROSS REFERENCE TO RELATED APPLICATION

This application is a continuation of International Patent Application No. PCT/JP2019/047394, having an international filing date of Dec. 4, 2019, which designated the United States, the entirety of which is incorporated herein by reference. Japanese Patent Application No. 2019-098028 filed on May 24, 2019 is also incorporated herein by reference in its entirety.

BACKGROUND

The present disclosure relates to a method for forming a coating film on a powder, a container for use in formation of the coating film on powder, an ALD apparatus, and the like.

A semiconductor manufacturing technology has been used for forming a coating film not only on a substrate, but also on a surface of a powder. At this time, the powder tends to easily condense. In JP-A-2008-38218, such a technology is disclosed as to form a coating film on a surface of a carbon carrier by performing sputtering while stirring or rotating the carbon carrier in a vacuum container, and thereby dispersing the carbon carrier.

In JP-A-2014-159623, such a technology is disclosed as to coat a surface of a powder with a material by a dry process, not by rotating a vacuum container itself, but by rotating or swinging a cylindrical container that is arranged in the vacuum container and contains the powder, with respect to the vacuum container.

In Japanese Patent No. 5761724, an atomic layer deposition (ALD) method is disclosed that can form a thin oxide film on an object to be film-formed at room temperature. In other words, this method does not need to forcibly heat the powder when forming the film. This advantage is disadvantageous to film formation on a powder that tends to easily agglomerate by moisture or the like, in a point that the powder tends to easily maintain condensation while the film is formed.

When the ALD disclosed in Japanese Patent No. 5761724 or the like is applied to a powder that is an object to be film-formed, it is conceivable to use the apparatus disclosed in JP-A-2008-38218 or JP-A-2014-159623. However, in JP-A-2008-38218 and JP-A-2014-159623, a dispersion operation of the powder by rotation or swinging must be simultaneously performed in an operation of forming a film on the powder. There is a restriction in a rotation speed for the dispersion that is performed simultaneously with the film formation. Because of this, a powder that is formed into a film particularly without being heated cannot be sufficiently dispersed at the relatively low rotation speed. Furthermore, there is also a problem that a film-forming apparatus having a rotation or swinging mechanism becomes large and complicated.

DESCRIPTION OF EXEMPLARY EMBODIMENTS

In the following disclosure, many different embodiments and examples will be provided for implementing presented features of which the subject matters are different. Of course, these are merely examples and are not intended to be limitative. Furthermore, in the present disclosure, there are cases where reference numbers and/or characters are repeated in various examples. This repetition is for the sake of brevity and clarity, and does not need that there is a relationship between itself and the various embodiments and/or configurations that are described. Furthermore, when it is described that a first element is "connected" or "coupled" to a second element, such description includes an embodiment in which the first element and the second element are integrated, or the first element and the second element are directly connected or coupled to each other, and also includes an embodiment in which the first element and the second element are indirectly connected or coupled to each other while having one or more other elements existing therebetween. In addition, when it is described that a first element "moves" to a second element, such description includes an embodiment of relative movement in which at least one of the first element and the second element moves relatively to the other.

The present disclosure is directed at providing a method for forming a coating film on a powder, a container for use in formation of the coating film on the powder and an ALD apparatus, which has a dispersion device and a film-forming apparatus separated from each other, thereby miniaturizes and simplifies the film-forming apparatus, simultaneously can simply perform handling of transferring the powder to be film-formed between both of the device and the apparatus, and can surely form the coating film on the surfaces of dispersed powders.

(1) In accordance with one of some embodiments, there is provided a method for forming a coating film on a powder, comprising:

a dispersion step of setting a container having contained the powder in a main body of a dispersion device, and dispersing the powder in the container by the main body of the dispersion device; and an ALD step of forming the coating film on a surface of the powder, by setting the container having been removed from the main body of the dispersion device in a main body of an ALD apparatus in such a state that gas can be introduced and be exhausted, introducing a gas for performing an ALD cycle into the container, filling the container with the gas, and then exhausting the gas.

According to the embodiment (1) of the present disclosure, the dispersion device is separated from the film-forming apparatus, the film-forming apparatus does not need to perform a dispersion operation of the powder (also referred to as fine particle) by rotation or swinging at the same time, and the film-forming apparatus is miniaturized and simplified accordingly. In the film-forming apparatus, the gas that is introduced into the container for performing an ALD cycle permeates among the powders that have been dispersed in advance. Thereby, the coating film having a thickness of an atomic layer level can be formed on the surface of the powder. Here, the powder is condensed mainly by an intermolecular force (van der Waals force). In other words, the smaller the powder size is, the more easily the powders agglomerate. In addition, the powders also agglomerate due to moisture or the like. When the dispersion step is performed before the ALD step, the agglomerating powder in the container can be sufficiently dispersed in advance by stirring or the like. In addition, the container is shared between the dispersion step and the ALD step, the handling of transferring the powder to be film-formed between both steps can be simplified.

(2) In accordance with one of some embodiments, there is provided the method for forming the coating film on the powder, wherein the ALD cycle may be performed without forcibly heating the powder.

The unheated powder tends to easily agglomerate due to moisture, but when the dispersion step is performed before the ALD step, the agglomerating powder in the container can be sufficiently dispersed by being stirred in advance.

(3) In accordance with one of some embodiments, there is provided a container to be used in the method for forming the coating film on the powder according to the embodiment (1) or (2), comprising:

a main body of the container for containing the powder;

a gas introduction port for introducing gas into the main body of the container therethrough;

an exhaust port for exhausting the inside of the main body of the container therethrough;

a first filter configured to be arranged in the main body of the container, and configured to inhibit the powder from passing therethrough toward the gas introduction port, while allowing the gas to pass therethrough; and a second filter configured to be arranged in the main body of the container, and configured to inhibit the powder from passing therethrough toward the exhaust port, while allowing the gas to pass therethrough, wherein the powder is contained in a powder containing chamber partitioned by the main body of the container, the first filter and the second filter, so as to be capable of being taken in and out.

According to the embodiment (3) of the present disclosure, the container is set in the dispersion device, which contains the powder in the powder containing chamber partitioned by the main body of the container, the first filter and the second filter, and is rotated or swung; and thereby the powder in the container, which agglomerates due to moisture or the like for example, can be dispersed by being stirred in advance. In the dispersion step, the gas introduction port and the exhaust port are not necessarily closed, because the first and second filters can prevent the powder from leaking out. In addition, the container is not a sealed state at the time of dispersion, air enters and exits from the container through the gas introduction port and the exhaust port, and the powder inside the container can be sufficiently dispersed. The container is set in the ALD apparatus, gas is introduced from the gas introduction port of the container, and the gas is exhausted from the exhaust port of the container; and thereby the ALD cycle is performed, and the coating film having the thickness of an atomic layer level can be formed on the surface of the powder.

(4) In accordance with one of some embodiments, there is provided the container, wherein the main body of the container may include:

a lid portion; and a main body portion configured so that the lid portion is airtightly attached thereto and the lid portion is detachable therefrom.

Due to this structure, when the lid is removed from the main body portion, the powder containing chamber is thereby opened, and the powder can be taken in and out from the powder containing chamber. When the lid portion is airtightly attached to the main body portion after the powder has been contained, the powder does not leak during the dispersion step, and besides, the ALD step in which gas is introduced and exhausted can be performed.

(5) In accordance with one of some embodiments, there is provided the container, wherein the lid portion may include the gas introduction port and the first filter, and the main body portion may include the exhaust port and the second filter.

Due to this structure, when the lid is removed from the main body portion, the first filter is thereby separated, the powder containing chamber is opened, and the powder can be taken in and out from the powder containing chamber. In addition, when a lot is exchanged to a powder having a different particle size or when the first filter is exchanged at the time of maintenance, the first filter displaced in the lid may be exchanged. Alternatively, the lid may be replaced with a lid that has been prepared for each type of the first filter.

(6) In accordance with one of some embodiments, there is provided the container, wherein the main body portion may include the gas introduction port and the first filter, and the lid portion may include the exhaust port and the second filter.

Due to this structure, when the lid is removed from the main body portion, the second filter is thereby separated, the powder containing chamber is opened, and the powder can be taken in and out from the powder containing chamber. In addition, when a lot is exchanged to a powder having a different particle size or when the second filter is exchanged at the time of the maintenance, the second filter displaced in the lid may be exchanged. Alternatively, the lid may be replaced with a lid that has been prepared for each type of the second filter.

(7) In accordance with one of some embodiments, there is provided the container, wherein the main body of the container may include a first lid portion, a second lid portion and a main body portion, wherein the first lid portion may be airtightly attached to one end of the main body portion and the first lid portion is detachable, and the second lid portion may be airtightly attached to the other end of the main body portion and the second lid portion is detachable.

Due to this structure, it becomes easy to exchange the first and second filters when a lot is exchanged to a powder having a different particle size or at the time of the maintenance. In other words, the first filter disposed in the first lid can be exchanged, or the first lid can be exchanged to a first lid that has been prepared for each type of the first filter. Similarly, the second filter disposed in the second lid can be exchanged, or the second lid can be exchanged to a second lid that has been prepared for each type of the second filter.

(8) In accordance with one of some embodiments, there is provided an ALD apparatus for forming a coating film on a surface of a powder, comprising:

the container according to any one of embodiments (3) to (7); and a main body of the ALD apparatus to which the container is set and which is configured to introduce a gas for performing an ALD cycle into the container, fill the container with the gas, subsequently exhaust the gas.

According to the further another embodiment (8) of the present disclosure, the container is set in the main body of the ALD apparatus, the gas for performing an ALD cycle is introduced from a gas introduction port, the container is filled with the gas, and the gas is exhausted from the exhaust port of the container; and thereby the ALD cycle is performed, and the coating film having the thickness of the atomic layer level can be formed.

Figure 1A:
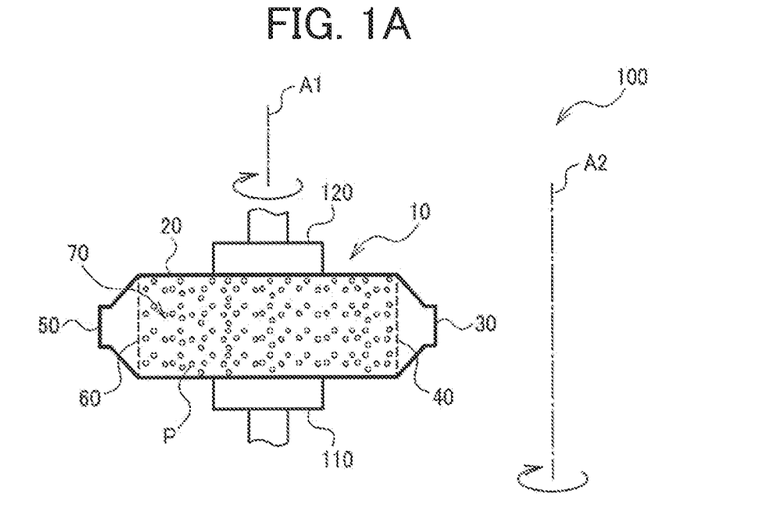
FIG. 1A illustrates a dispersion step of one embodiment of a method of the present disclosure.
Figure 1B:
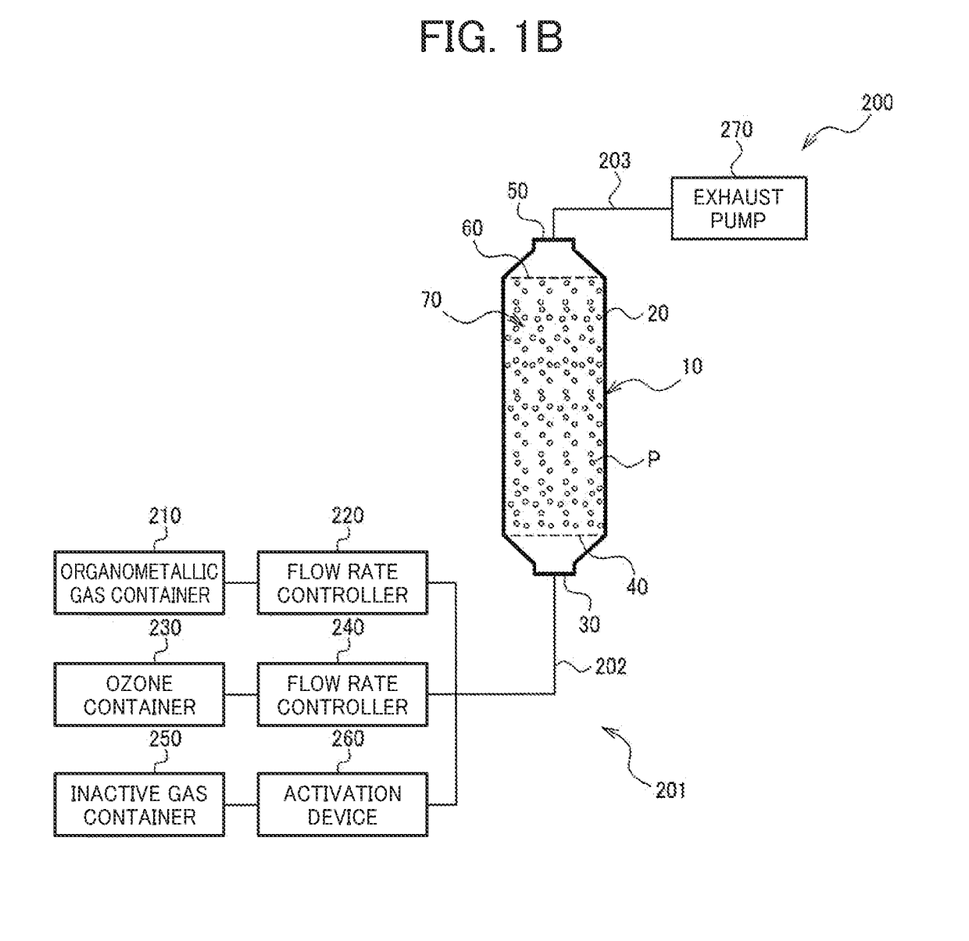
FIG. 1B illustrates an ALD step of the one embodiment of the method of the present disclosure.

One embodiment of a method for forming a coating film of the present disclosure includes a dispersion step illustrated in FIG. 1A and an ALD step illustrated in FIG. 1B.

1. Dispersion Step and Dispersion Device

In the dispersion step illustrated in FIG. 1A, a container 10 containing a powder P is set in a main body 100 of a dispersion device. The container 10 and the main body 100 of the dispersion device constitute the dispersion device. Here, the powder P can be a fine particle having a size of, for example, micron, sub-micron, or nano order, and may be made of any material. The smaller the size of the powder P is, the easier it is for the powder P to condense, and accordingly the necessity of dispersing the powder P before film formation increases. In addition, for convenience of drawing figures in FIGS. 1A and 1B, the powder P in the powder containing chamber 70 is scattered, but the powder containing chamber 70 of the container 10 may be fully loaded with the powder P having a total weight of, for example, 10 kg that corresponds to one batch treatment. However, a surplus space is secured in the powder containing chamber 70 to an extent that the agglomerating powder P is dispersed by being stirred.

The container 10 can include: a main body 20 of the container for containing the powder P; a gas introduction port 30 for introducing gas into the main body 20 of the container therethrough; a first filter 40 disposed in the main body 20 of the container; an exhaust port 50 for exhausting the inside of the main body 20 of the container; and a second filter 60 disposed in the main body 20 of the container. The first filter 40 allows the gas to pass therethrough, but on the other hand, inhibits the powder P from passing therethrough toward the gas introduction port 30. The second filter 60 allows the gas to pass therethrough, but on the other hand, inhibits the powder P from passing therethrough toward the exhaust port 50. In addition, the powder P is contained in the powder containing chamber 70 that is partitioned by the main body 20 of the container, the first filter 40, and the second filter 60, so as to be capable of being taken in and out. For information, in FIG. 1A, a part of the powder containing chamber 70 is opened, and a lid portion is omitted that is airtightly attached to the main body 20 of the container.

The main body 100 of the dispersion device illustrated in FIG. 1A includes a first holding member 110 and a second holding member 120; and the container 10 is pressed between the first and second holding members 110 and 120, is sandwiched therebetween and is fixed. It is acceptable to dispose a positioning portion that positions the container 10 onto one of the first and second holding members 110 and 120, in order that the container 10 resists the centrifugal force. The main body 100 of the dispersion device can include a rotation drive unit that rotationally drives the container 10 around a rotation axis A1. The main body 100 of the dispersion device can further include a revolution drive unit that rotationally drives the container 10 around a revolution axis A2. The rotation axis A1 and the revolution axis A2 extend in a parallel or intersecting direction. It should be noted that the drive unit for stirring and dispersing the powder P in the container 10 is not limited to the rotation and/or revolution type, but may be a swinging type, a vibration type, or the like.

Figure 2:
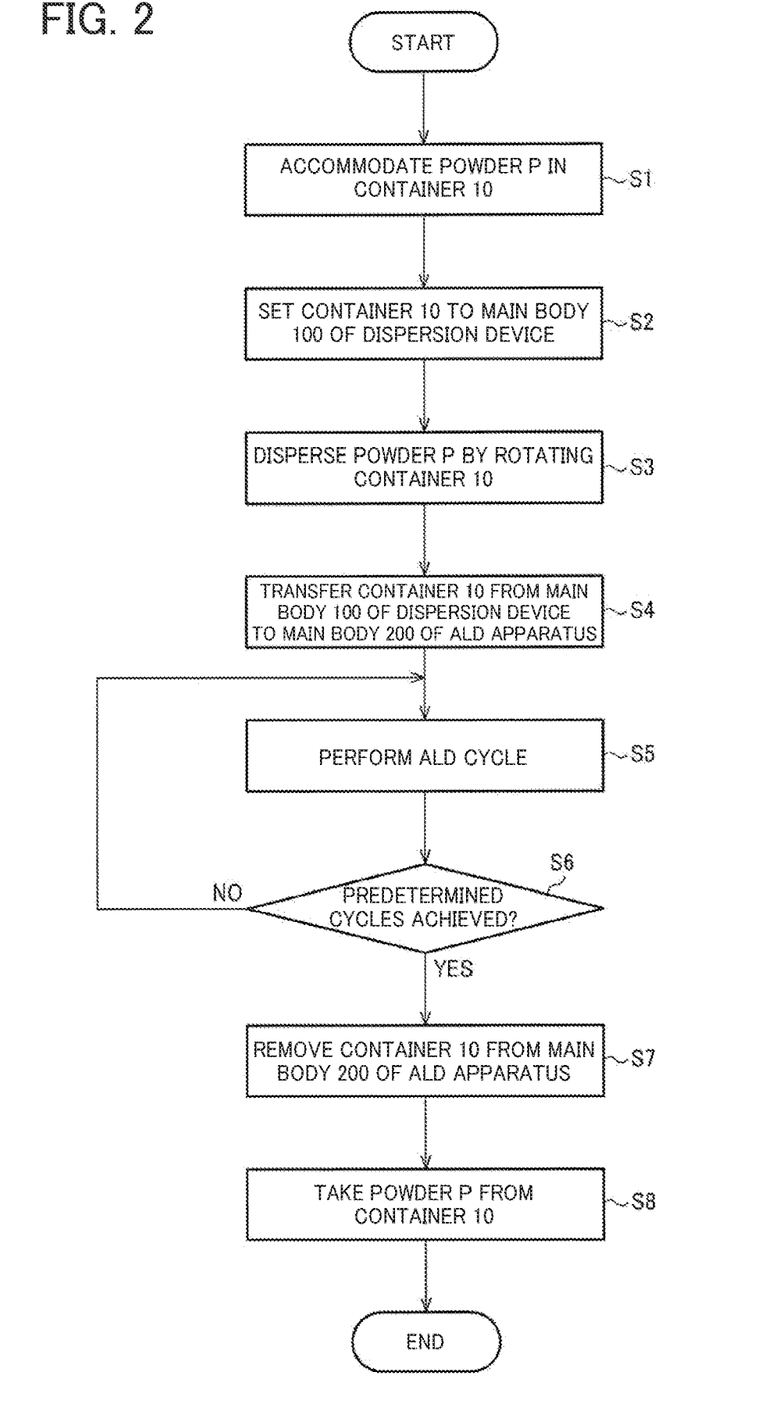
FIG. 2 is a flow chart illustrating one embodiment of the method of the present disclosure.

In Step 1 illustrated in FIG. 2, firstly, the lid portion that is not illustrated is opened, and the container 10 accommodates the powder P therein. After that, the lid portion is airtightly attached to seal the powder P in the container 10. At this time, the gas introduction port 30 and the exhaust port 50 of the container 10 are opened, but the powder P in the inside is inhibited from leaking out to the outside by the first and second filters 40 and 60. In addition, the container 10 is not in a sealed state at the time of dispersion, and air enters and exits from the container 10 through the gas introduction port 30 and the exhaust port 50; and accordingly the powder P inside the container 10 can be sufficiently dispersed.

Next, in Step 2 illustrated in FIG. 2, the container 10 is set in the main body 100 of the dispersion device as is illustrated in FIG. 1A. After that, in Step 3 illustrated in FIG. 2, the dispersion step is carried out. In the dispersion step, the container 10 that is pressed and sandwiched between the first and second holding members 110 and 120 and is fixed is rotationally driven around the rotation axis A1 and/or the revolution axis A2. Thereby, the powder P in the container 10 is stirred and dispersed. In particular, even if the powder P has agglomerated due to moisture or the like for example, the powder P in the container 10 is dispersed by the implementation of the dispersion step.

When the dispersion step has been finished, in Step 4 illustrated in FIG. 2, the container 10 is transferred from the main body 100 of the dispersion device to the main body 201 of the ALD apparatus. For this purpose, in the main body 100 of the dispersion device, a pressing force between the first and second holding members 110 and 120 is released, and the container 10 is taken out. This container 10 is transferred as in the state, to the main body 201 of the ALD apparatus illustrated in FIG. 1B. Accordingly, the container 10 is shared by the dispersion step and the ALD step, and accordingly it becomes possible to simplify the handling of transferring the powder P between both of the steps.

2. ALD Step and ALD Apparatus

In FIG. 1B, one example of an ALD apparatus 200 that includes the container 10 and the main body 201 of the ALD apparatus is illustrated. The main body 201 of the ALD apparatus includes: a gas introduction pipe 202 that is airtightly connected to the gas introduction port 30 of the container 10; and an exhaust pipe 203 that is airtightly connected to the exhaust port 50 of the container 10.

An organometallic gas container 210 is connected to the gas introduction pipe 202 via a flow rate controller 220. An ozone container 230 is connected to the gas introduction pipe 202 via a flow rate controller 240. In addition, an inert gas container 250 is connected to the gas introduction pipe 202 via an activation device 260. It should be noted that an inert gas that serves as a purge gas can be supplied to the gas introduction pipe 202 at a controlled flow rate, though such configuration is not illustrated in FIG. 1B. An exhaust pump 270 is connected to the exhaust pipe 203, and can evacuate the inside of the container 10. Note that the purge gas is used for exhausting a raw material gas in the container 10, but in place of introduction of the purge gas, the inside of the container 10 may be exhausted by a vacuum pump 270.

Figure 3:
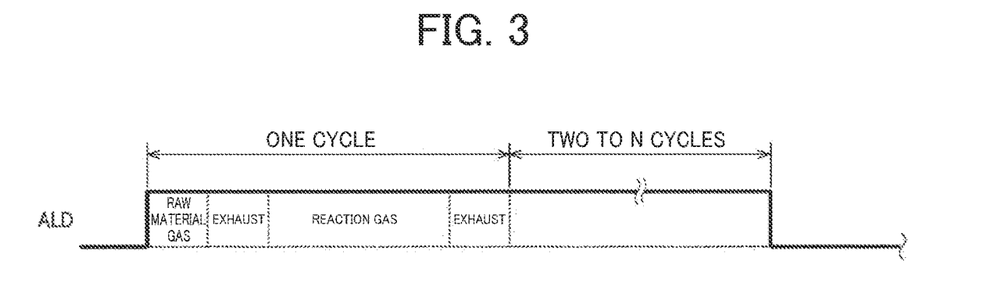
FIG. 3 is a view for explaining an ALD cycle.

As is illustrated in FIG. 1 B, the container 10 is set in the main body 201 of the ALD apparatus, and at least one ALD cycle is performed in Step 6 illustrated in FIG. 2. As is illustrated in FIG. 3, one cycle of the ALD cycles is defined to be at least four steps of: introduction of a raw material gas exhaust (including purge) introduction of a reaction gas exhaust (including purge). The thickness of a coating film formed by the powder P is proportional to the number N of the ALD cycles. Therefore, in Step 7 illustrated in FIG. 2, it is determined whether or not the number of cycles, which is counted up, has reached the set value, and the ALD cycle of Step 6 is repeatedly performed as many times as necessary.

A type of coating film that is formed by the ALD apparatus 200 is an oxide film or a nitride film, and one example will be described below in which a coating film of $Al_2O_3$ is formed as one example of the oxide film. In this case, for example, trimethylaluminum $Al(CH_3)_3$ and an OH radical (OH*) are used as two types of precursors. Trimethylaluminum that is the raw material gas is supplied from the organometallic gas container 210. The OH radical that is obtained by activating the reaction gas is generated in the activation device 260.

Figure 4:
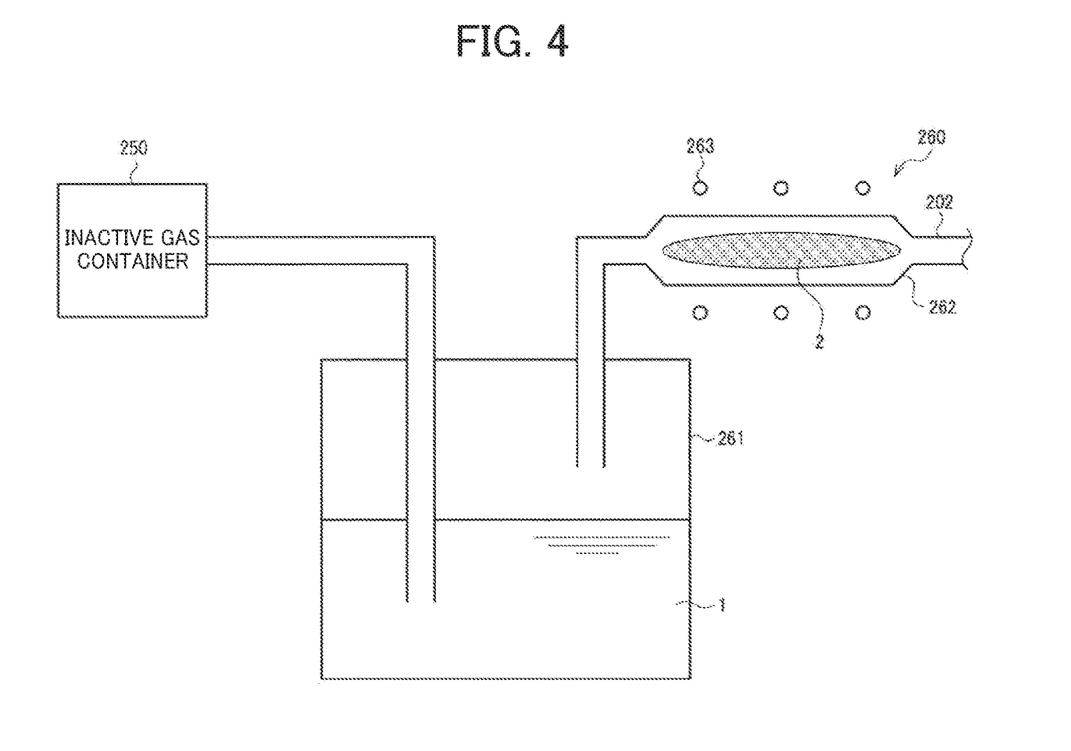
FIG. 4 is a view illustrating one example of an activation device.

For this purpose, an inert gas such as argon Ar is supplied from the inert gas container 250 to the activation device 260. As is illustrated in FIG. 4, the activation device 260 includes: a humidifier 261 in which water 1 is stored; and a plasma generation chamber 262 that communicates with the gas introduction pipe 202. An inert gas, for example, argon Ar is introduced from the inert gas container 250 into the humidifier 261. The water 1 becomes a water vapor gas by being bubbled by argon Ar, and the water vapor gas is supplied to the plasma generation chamber 262. An induction coil 263 is disposed around the plasma generation chamber 262 made of, for example, quartz. A high-frequency power source that is not illustrated is connected to the induction coil 263. Electromagnetic energy that is applied by the induction coil 263 is 20 W and the frequency is 13.56 MHz, for example. The inductively coupled plasma 2 of the reaction gas is generated in the plasma generation chamber 262 by the induction coil 263. Thereby, a reaction $Ar+H_2O \rightarrow Ar^*+OH^*+H^*$ occurs, and the OH radical (OH*) can be generated. Due to the OH radical (OH*) that is supplied to the container 10 through the gas introduction pipe 202, a coating film can be formed at a low temperature, for example, at room temperature, as will be described later, even though the powder P is not forcibly heated.

When the ALD cycle is performed, firstly, the inside of the container 10 is evacuated by the exhaust pump 270, and the atmospheric pressure is set at, for example, $10^{-4}$ Pa. Next, as the first step of the ALD cycle, the container 10 is filled with trimethylaluminum $Al(CH_3)_3$ at a predetermined pressure of, for example, 1 to 10 Pa. In the first step of the ALD cycle, trimethylaluminum $Al(CH_3)_3$ penetrates among the powders P. After a predetermined time period has elapsed, as the second step of the ALD cycle, a purge gas is introduced into the container 10, and the trimethylaluminum $Al(CH_3)_3$ in the container 10 is replaced with the purge gas.

Next, as the third step of the ALD cycle, the container 10 is filled with the OH radical (OH*) at a predetermined pressure, for example, 1 to 10 Pa. In the third step of the ALD cycle, the OH radical (OH*) penetrates among the powders P. As a result, on the surface of the powder P, the trimethylaluminum $Al(CH_3)_3$ reacts with the OH radical (OH*), and aluminum oxide $Al_2O_3$ is formed. Thereby, the surface of the powder P is covered with the oxide film. In particular, hydroxy groups (—OH) on the surface of the powder P can adsorb and be saturated with the organometallic gas even at room temperature. Therefore, the powder P does not need to be forcibly heated while the coating film is formed. After a predetermined time period has elapsed, as the fourth step of the ALD cycle, a purge gas is introduced into the container 10, and the OH radicals (OH*) in the container 10 are replaced with the purge gas. The $Al_2O_3$ film can be formed by approximately 1 angstrom=0.1 nm in one cycle, and accordingly the ALD cycle may be repeated 100 times in order to form the film of 10 nm thick, for example. The coating film can be formed as a single layer or multiple layers. In the case of multiple layers, the material is switched according to the type of the coating film to be formed. As for a modified example of the ALD cycle, it is acceptable to fill the container 10 with ozone at a predetermined pressure of, for example, 1 to 10 Pa through the ozone container 230 and the flow rate controller 240, before the OH radicals (OH*) are introduced into the container 10, and then the ozone may be discharged by the purge gas. By introducing ozone, it becomes possible to prevent unreacted carbon from being mixed into the film.

3. Container

Figure 5:
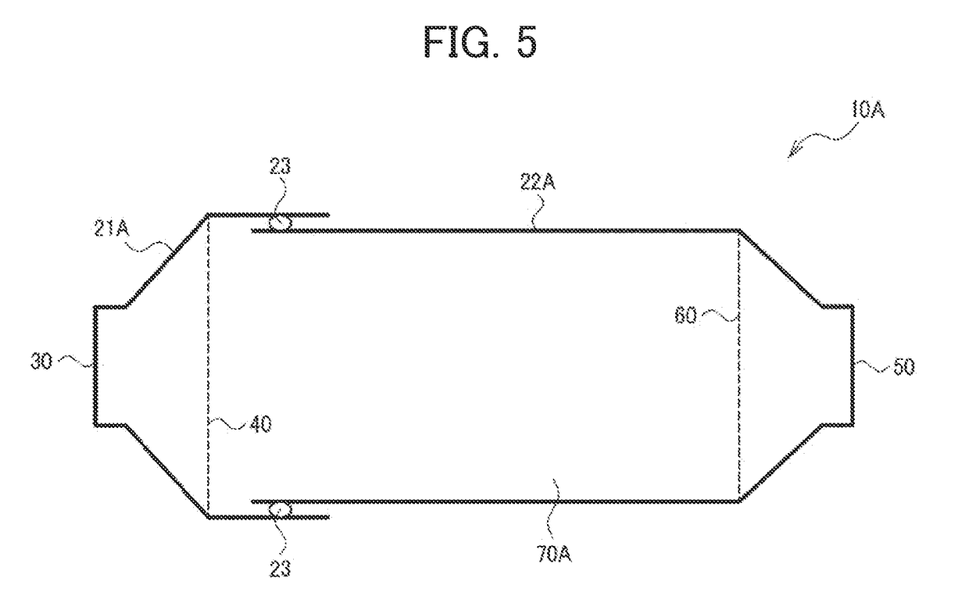
FIG. 5 is a cross-sectional view of a container according to one embodiment of the present disclosure.
Figure 6:
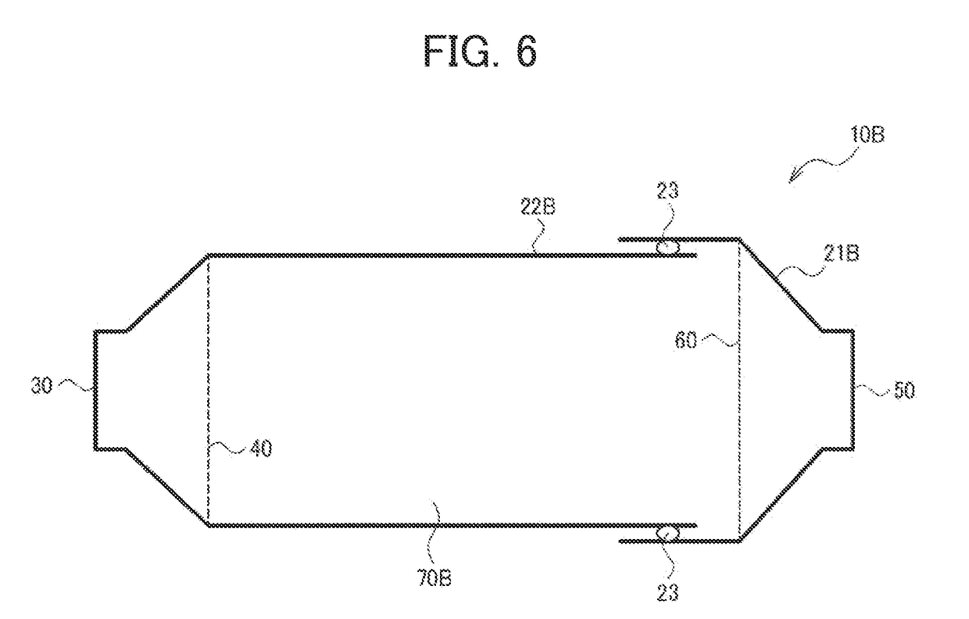
FIG. 6 is a sectional view of a container according to another embodiment of the present disclosure.
Figure 7:
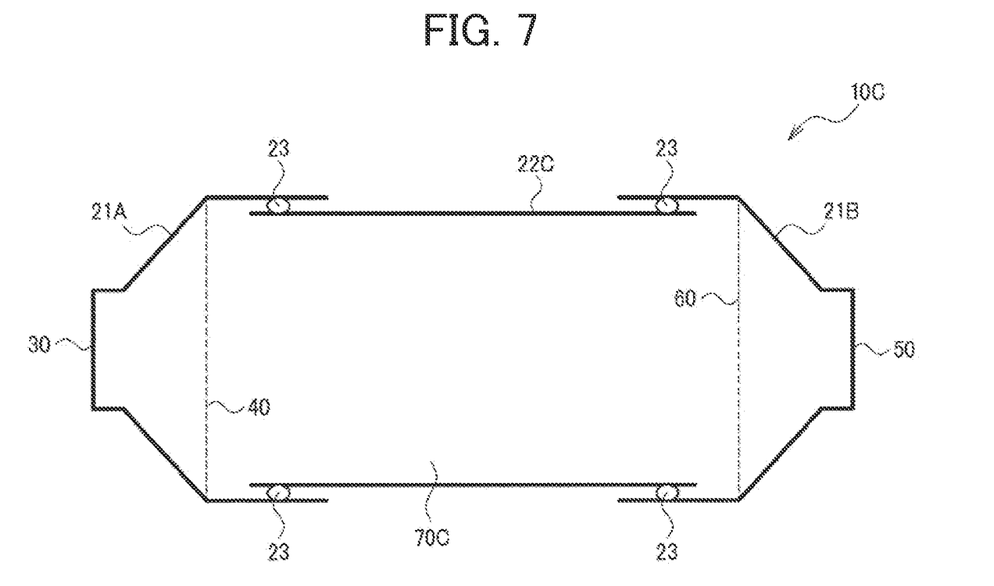
FIG. 7 is a sectional view of a container according to a further another embodiment of the present disclosure.

FIGS. 5 to 7 illustrate containers 10A, 10B and 10C that can be opened by a lid portion 21A and/or a lid portion 21B. In FIG. 5, the lid portion 21A having the gas introduction port 30 and the first filter 40 is detachable from a main body portion 22A via an airtight sealing member 23. By removing the lid portion 21A, the powder P can be taken in and out from the powder containing chamber 70A of the container 10A. In FIG. 6, the lid portion 21B having the exhaust port 50 and the second filter 60 is detachable from a main body portion 22B via an airtight sealing member 23. By removing the lid portion 21B, the powder P can be taken in and out of the powder containing chamber 70B of the container 10B. In FIG. 7, the lid portion 21A having the gas introduction port 30 and the first filter 40, and the lid portion 21B having the exhaust port 50 and the second filter 60 are detachable from a main body portion 22C via the airtight sealing member 23. By removing at least one of the lid portion 21A and the lid portion 21B, the powder P can be taken in and out from the powder containing chamber 70C of the container 10C. The lid portion 21A and/or the lid portion 21B can be fixed to the 22A, 22B or 22C of the main body portion with the use of well-known screw engagement, fastening means such as bolts and fastening rings, and the like.

Here, for the first and second filters 40 and 60, a plurality of types having different mesh sizes can be prepared according to the size of the powder P to be film-formed. In this case, the first or second filter 40 or 60 can be arranged integrally with the lid portion 21A or the lid portion 21B, or detachably to the lid portion 21A or the lid portion 21B. This is because it is easy to exchange the first and second filters 40 and 60 having different mesh sizes according to the size of the powder P to be film-formed.

For information, when TDMAS ($SiH[N(CH_3)_2]_3$) is used as the raw material gas, and the OH radical (OH*) is used as an activated reaction gas (oxidizing gas), a coating film of SiN can be formed on the surface of the powder P. Also in this case, the hydroxy groups (—OH) on the surface of the powder P can adsorb and be saturated with the organometallic gas even at room temperature.

In addition, a metal nitride film can be formed as the coating film with the use of, for example, a nitriding gas, in place of an oxidizing gas that is a reaction gas to be used in the case where a metal oxide film is formed as the coating film. In this case, for example, $NH_3$ in which an NH radical is formed can be used as the nitriding gas that is the reaction gas. For example, when TDMAS (SiH[N(CH$_3$)$_2$]$_3$) is used as the raw material gas, a coating film of SiN can be formed on the powder P. For example, when TDMAT (Ti[N(CH$_3$)$_2$]$_4$) is used as a raw material gas, a coating film of TiN can be formed on the powder P. In any case, a low temperature process can be realized due to the presence of the NH radical.

What is claimed is:

1. A method for forming a coating film on a powder, comprising:
    a dispersion step of setting a container having contained the powder in a main body of a dispersion device, and dispersing the powder in the container by at least one of rotating, revolving, swinging, and vibrating the main body of the dispersion device; and
    an ALD step of forming the coating film on a surface of the powder, by setting the container having been removed from the main body of the dispersion device in a main body of an ALD apparatus in such a state that gas can be introduced and be exhausted, introducing a gas for performing an ALD cycle into the container, filling the container with the gas, and then exhausting the gas.

2. The method for forming the coating film on the powder according to claim 1, wherein
    the ALD cycle is performed without forcibly heating the powder.

3. The method for forming the coating film on the powder according to claim 1, wherein dispersing of the powder in the container is at least one of rotated and revolved.

4. The method for forming the coating film on the powder according to claim 1, wherein after the dispersion step, there is a step of removing the container with the powder therein from the dispersion device before the step of setting the container in a main body of an ALD apparatus.

5. The method for forming the coating film on the powder according to claim 4, wherein the ALD cycle is performed without forcibly heating the powder.

6. The method for forming the coating film on the powder according to claim 4, wherein dispersing of the powder in the container is performed by at least one of rotating and revolving the container.

7. The method for forming the coating film on the powder according to claim 5, wherein dispersing of the powder in the container is performed by at least one of rotating and revolving the container.

8. The method for forming the coating film on the powder according to claim 1, wherein the dispersion step is performed prior to the step of ALD, wherein the coating film has a desired thickness corresponding to a predetermined number of ALD cycles, wherein the predetermined number of cycles ALD is completed before removal of the container from the ALD apparatus whereby the desired thickness of the coating film is obtained and wherein the step of removal of the container occurs when a predetermined number of cycles of ALD has been achieved.

9. The method for forming the coating film on the powder according to claim 8, wherein after the dispersion step, there is a step of removing the container with the powder therein from the dispersion device before the step of setting the container in a main body of an ALD apparatus.

10. The method for forming the coating film on the powder according to claim 9, wherein the ALD cycle is performed without forcibly heating the powder.

11. The method for forming the coating film on the powder according to claim 8, wherein dispersing of the powder in the container is performed by at least one of rotating and revolving the container.

12. The method for forming the coating film on the powder according to claim 9, wherein dispersing of the powder in the container is performed by at least one of rotating and revolving the container.

13. A container to be used in a method for forming a coating film on a powder, comprising:
    a main body of the container for containing the powder;
    a gas introduction port for introducing gas into the main body of the container therethrough;
    an exhaust port for exhausting the inside of the main body of the container therethrough;
    a first filter configured to be arranged in the main body of the container, and configured to inhibit the powder from passing therethrough toward the gas introduction port, while allowing the gas to pass therethrough; and
    a second filter configured to be arranged in the main body of the container, and configured to inhibit the powder from passing therethrough toward the exhaust port, while allowing the gas to pass therethrough, wherein
    the powder is contained in a powder containing chamber partitioned by the main body of the container, the first filter and the second filter, so as to be capable of being taken in and out,
    the main body of the container includes a first lid portion, a second lid portion and a main body portion, wherein
    the first lid portion is airtightly attached to one end of the main body portion and the first lid portion is detachable, and
    the second lid portion is airtightly attached to the other end of the main body portion and the second lid portion is detachable.

14. The container according to claim 13, wherein
    the first lid portion includes the gas introduction port and the first filter, and
    the second lid portion includes the exhaust port and the second filter.

15. An ALD apparatus for forming a coating film on a surface of a powder, comprising:
    the container according to claim 13; and
    a main body of the ALD apparatus to which the container is set and which is configured to introduce a gas for performing an ALD cycle into the container, fill the container with the gas, subsequently exhaust the gas.

* * * * *